United States Patent [19]
Tanaka et al.

[11] 4,441,038
[45] Apr. 3, 1984

[54] ELECTRET DEVICE

[75] Inventors: Masamichi Tanaka, Yamato; Hiroto Wada, Yokosuka, both of Japan

[73] Assignee: Tokyo Shibaura Denki Kabushiki Kaisha, Japan

[21] Appl. No.: 499,873

[22] Filed: Jun. 1, 1983

Related U.S. Application Data

[63] Continuation of Ser. No. 280,056, Jun. 30, 1981, abandoned.

[30] Foreign Application Priority Data

| Jun. 30, 1980 | [JP] | Japan | 55-88778 |
| Jun. 30, 1980 | [JP] | Japan | 55-88779 |
| Jun. 30, 1980 | [JP] | Japan | 55-88818 |
| Jun. 30, 1980 | [JP] | Japan | 55-88820 |
| Jun. 30, 1980 | [JP] | Japan | 55-88783 |
| Jun. 30, 1980 | [JP] | Japan | 55-88785 |
| Jun. 30, 1980 | [JP] | Japan | 55-88786 |
| Jun. 30, 1980 | [JP] | Japan | 55-88787 |

[51] Int. Cl.³ .............................................. G11C 13/02
[52] U.S. Cl. ................................................. 307/400
[58] Field of Search ........................ 307/400; 365/146; 29/592 E; 361/233

[56] References Cited

U.S. PATENT DOCUMENTS

| 3,436,492 | 4/1969 | Reedyk | 307/400 |
| 3,890,511 | 6/1975 | Haugsjaa et al. | 307/400 |
| 3,967,027 | 6/1976 | Igarashi et al. | 307/400 |
| 4,250,415 | 2/1981 | Lewiner | 307/400 |

*Primary Examiner*—James W. Moffitt
*Attorney, Agent, or Firm*—Finnegan, Henderson, Farabow, Garrett & Dunner

[57] ABSTRACT

An electret device having improved uniformity of surface charge distribution, wherein a polarized dielectric body is secured at its one flat surface to a conductive electrode and attached to a cover body at its other flat surface opposite to the conductive electrode. The cover body may be comprised of any conductive, semi-conductive or non-conductive material.

14 Claims, 12 Drawing Figures

ELECTRET DEVICE

This is a continuation of application Ser. No. 280,056, filed June 30, 1981 now abandoned.

FIELD OF THE INVENTION

This invention relates to an electret device, more particularly, to an electret device having an exceedingly uniform surface charge distribution.

BACKGROUND OF THE INVENTION

An electret is a dielectric body having a high degree of surface electric charge. The electret retains its surface electric charge for a long period of time, often measured in tens of years. The electric charge, or dielectric polarization, is achieved, for example, in one prior art process by heating a body of dielectric material to a relatively high temperature while the material is exposed to an intense electric field for a substantial period of time, and then cooling the material while maintaining its exposure to the electric field. Upon cooling, the material exhibits characteristics of a permanent charge distribution.

Electrets have many uses as a transducer in a device such as a microphone, a loudspeaker and a record disk pick-up. Moreover, it is anticipated that electrets will be used in the near future as memory units, high potential sources, measuring apparatus and the like.

Electrets comprise dielectrics which produce static electric fields having relatively long lifetimes. Their long lifetimes are primarily attributable to the development of new materials which are more stable than previously employed wax materials. Today, plastic materials such as polyethylene, polypropylene, and polyethylene terephthalate are extensively used in constructing electrets.

Conventionally, electrets are constructed in the form of electret devices in which an electret body is secured on a conductive electrode. Such electret devices have drawbacks, in that their surface charge distribution is less than uniform.

SUMMARY OF THE INVENTION

Accordingly, it is an object of the present invention to provide an electret device having an exceedingly uniform surface charge distribution.

Another object of the present invention is to provide an electret device having an expanded lifetime.

A further object of the present invention is to provide an electret device having a surface charge which can be adjusted to the desired magnitude.

A still further object of the present invention is to provide an electret device which can be employed in any polarity.

To achieve the foregoing objects in accordance with the invention as embodied and broadly described herein, the electret device is comprised of a dielectric body provided with a surface electric charge, a conductive electrode secured on one surface of the dielectric body, and a cover body attached on the opposite surface of the dielectric body.

Further objects, features and advantages of the present invention will become apparent to persons skilled in the art from a study of the following description of the accompanying drawings, in which:

DESCRIPTION OF THE PREFERRED EMBODIMENT

Figure 1:
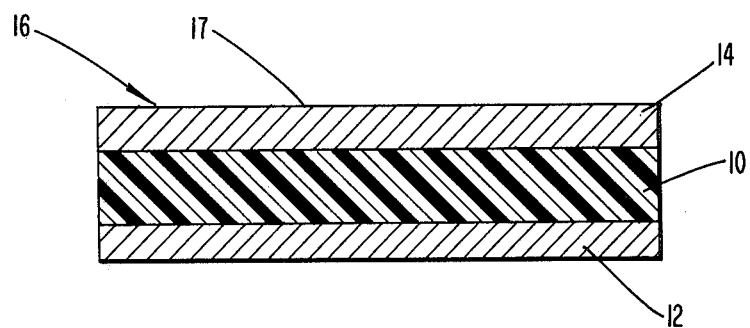
FIG. 1 is a sectional view of an electret device constructed according to the present invention.

The present invention will be described in detail with reference to the drawings (FIG. 1 to FIG. 11). Throughout the drawings, like reference numerals are used to designate like or equivalent portions, for the sake of clarity and simplicity of explanation.

FIG. 1 shows a sectional view of an electret device according to the present invention. Dielectric body 10 is formed in a flat plate-like configuration with two substantially flat and generally parallel surfaces, and is provided with a volume of electric charge. Conductive electrode 12 is secured on one flat surface of dielectric body 10. Cover body 14 is formed on the other flat surface of dielectric body 10 by e.g., coating, plating or spattering technique, opposite to conductive electrode 12. The combination of dielectric body 10 and conductive electrode 12 is similar to conventional electret devices.

Typically, polarization of dielectric body 10 is carried out by, for example, imposing an electrical field or applying charged particles, e.g., ions, before or after conductive electrode 12 is secured to dielectric body 10. The polarity of dielectric body 10 may be determined by the polarity of the electrical field or the charged particles.

Most dielectric materials are suitable for forming dielectric body 10 in the electret of the present invention. However, high molecular weight compounds, such as polypropylene, teflon ® (flourine-containing polymers) or polyethylene are especially suitable because the electric charge in these materials becomes relatively high in potential and is maintained for a long period of time.

Cover body 14 may be formed from a material selected from any conductive, semi-conductive or non-conductive material, or mixtures thereof, and/or mixed with other substances. For example, non-conductive materials such as glass or organic compounds, having a volume resistivity of more than $10^{12}\Omega$-cm are particularly suitable. The polarization of dielectric body 10 must be carried out before cover body 14 is attached to dielectric body 10 if cover body 14 is made of a non-conductive or dielectric material.

In the electret device 16 described above, cover body 14 is polarized dielectrically under the effect of charged dielectric body 10. A positive polarity appears on cover body 14 at its outer surface 17 if the polarity of the surface charge of dielectric body 10 is positive, and vice versa. That is, a polarity which is the same as the polarity of the surface charge of dielectric body 10 appears on the outer surface 17 of cover body 14.

Figure 2:
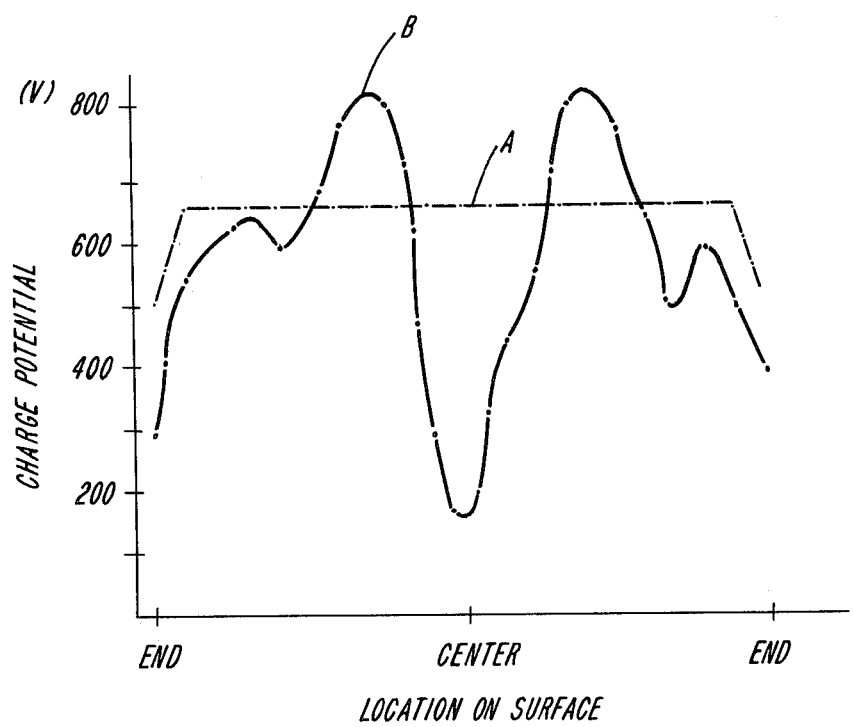
FIG. 2 is a diagram comparing charge potential distributions on a conventional electret device and an electret of the invention.

FIG. 2 shows a diagram comparatively illustrating the potential distribution characteristics of electret device 16 constructed according to the present invention and a conventional electret device. Graph A shows the potential distribution characteristics of electret device 16 according to the present invention, and graph B shows the potential distribution characteristics of a conventional electret device similar in size to that of the present invention. As may be seen from the almost flat characteristics of graph A, electret device 16 according to the present invention exhibits an exceedingly uniform surface charge at every part of the outer surface 17 of cover body 14. On the other hand, the conventional electret device does not exhibit a uniform surface charge.

Electret device 16 of the present invention is, therefore, very useful, due to its improved uniformity of surface charge distribution. That is, for example, transducers using electret device 16 of the present invention can provide improved high-fidelity transducing characteristics, since the electrostatic forces arising between electret device 16, as one electrode of a transducing capacitor, and an opposing electrode are uniform at every part of the transducing capacitor.

Electret device 16 constructed according to the present invention exhibits exceedingly long lived charge or polarization retention properties, since dielectric body 10 is protected from exposure to the air by cover body 14, and thus the charge becomes hard to drain away from dielectric body 10.

Figure 3:
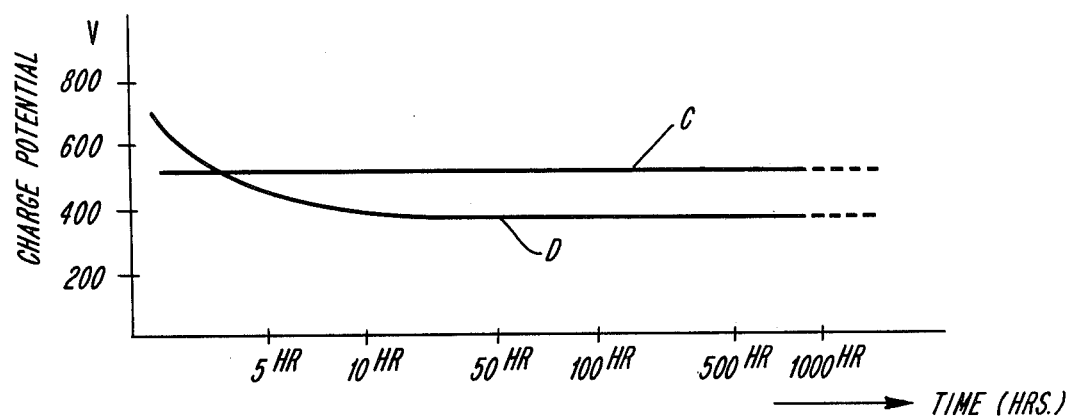
FIG. 3 is a diagram illustrating the charge retention properties of electret devices constructed in accordance with the present invention.

The charge retention properties of the electret device of the present invention are shown in FIG. 3. Graph C shows the properties of an electret device 16 having a cover body 14 which is comprised of a conductive material, e.g., a metal. On the other hand, graph D shows the properties of an electret device 16 whose cover body 14 is made from a non-conductive material, for example, acrylonitrile-butadien-styrene (ABS) copolymer. The charge potential shown in graph C is maintained for a long period of time at almost the same value as at the time of its fabrication, while the charge potential shown in graph D gradually decreases after the time of its fabrication and approaches a steady state condition around 24 hours afterwards. Then, both of the charge potentials remain at a steady state for a very long period of time.

Furthermore, the surface charge of an electret device 16 having a cover body 14 made of a conductive material may be easily increased when it diminishes by merely supplying a high voltage potential between conductive electrode 12 and conductive cover body 14, since dielectric body 10 will be repolarized by the high voltage potential.

Figure 4A:
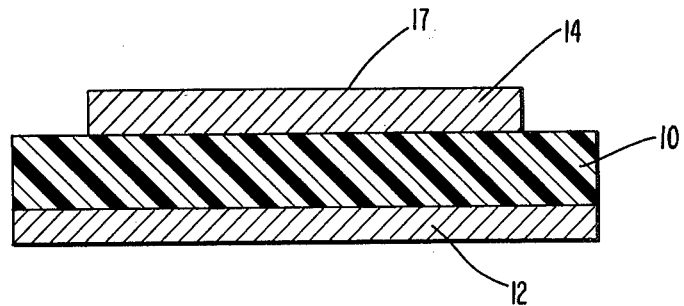
FIGS. 4a and 4b are sectional views of further embodiments of the present invention.
Figure 4B:
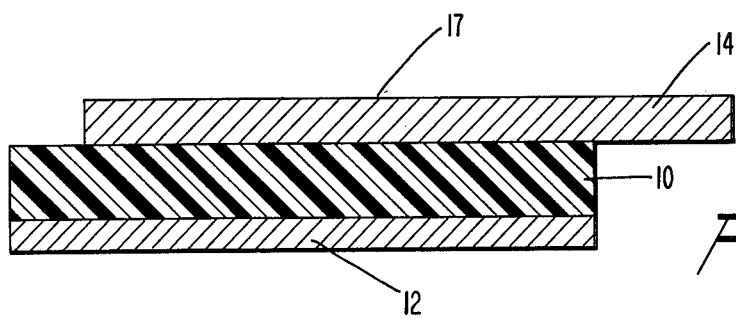
Figure 5:
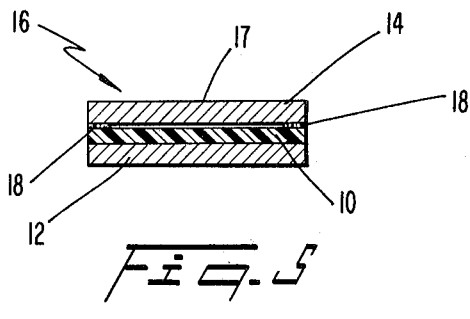
FIGS. 5–11 are sectional views of other embodiments constructed according to the present invention, illustrating various mechanical attachment means for the electret device.
Figure 6:
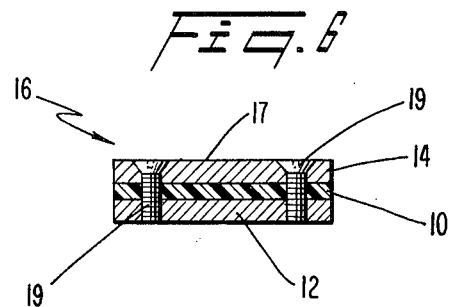

The surface area of cover body 14 may be made the same as or smaller or larger than that of dielectric body 10, as shown in FIGS. 4a and 4b. In an electret device having a smaller area cover body 14 than dielectric body 10, as shown in FIG. 4a, the charge potential is the same as that of an electret device 16 having the same area cover body 14, as shown in FIG. 1. The charge potential of such electret devices 16 is given by the following equation:

$$E_s = K \cdot E_o$$

where Es represents a charge potential of electret device 16 as a whole, in volts, Eo represents the average charge potential of dielectric body 10, in volts, and K is the polarization constant of the material of cover body 14. The value of Es is always lower than the value of Eo, since the constant K is less than one. The constant K for metallic materials is a numerical value between 0.6 and 0.99, and the constant K of glass is around 0.83, according to our measurements. Therefore, the charge potential of electret device 16 may be regulated to the desired value by the selection of the material comprising cover body 14, provided that the desired potential is lower than the average charge potential of dielectric body 10.

In an electret device 16 having a cover body 14 of larger area than dielectric body 10, as shown in FIG. 4b, the charge potential is a function of the surface area ratio according to the overlapping condition of dielectric body 10 and cover body 14, as described below:

$$E_s = K \cdot E_o \cdot (S_1/S_2)$$

where Es represents the charge potential of electret device 16 as a whole, in volts, Eo represents the average charge potential of dielectric body 10, in volts, K represents the polarization constant of the cover body material, $S_2$ represents the surface area of cover body 14 and $S_1$ represents the overlapping area of cover body 14 over dielectric body 10. That is, the charge potential of the whole of electret device 16 becomes lower than that of dielectric body 10, provided that cover body 14 extends beyond the surface of dielectric body 10, i.e., has a larger surface area. Therefore, the charge potential may also be regulated to the desired value by changing the surface area or the position of cover body 14 over dielectric body 10, provided that the desired potential is lower than that of dielectric body 10.

The lowering of the charge potential is probably due to a repulsion between the dielectric charges on the outer surface 17 of cover body 14, which is spaced from dielectric body 10.

Cover body 14 and dielectric body 10 must be fixed to each other, in view of the fact that the charge potential Es of electret device 16 changes in accordance with the relative size and location of cover body 14 and dielectric body 10, as explained above.

Figure 7:
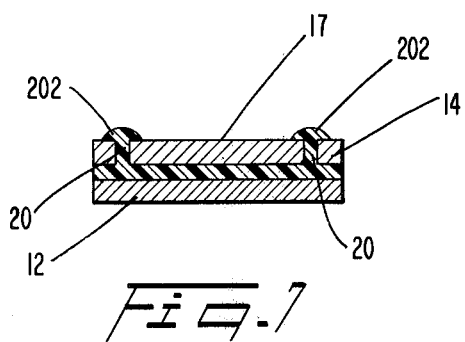

FIGS. 5-11 show the electret device of the present invention embodied with various mechanical securing means. In the electret device 16 of FIG. 5, cover body 14 and dielectrical body 10 are fixed to each other by a binding agent 18. In electret devices 16 of FIGS. 6 and 7, cover body 14 and dielectric body 10 are secured to each other by studs, such as screws 19 or pins 20, projecting from dielectric body 10. When cover body 14 is comprised of a metal, the material of screws 19 is selected from non-conductive materials in order to avoid electrical conduction between conductive electrode 12 and cover body 14. As shown in FIG. 7, the top portions of projecting pins 20 are formed into swelled head portions 202 after cover body 14 is fixed to dielectric body 10.

Figure 8:
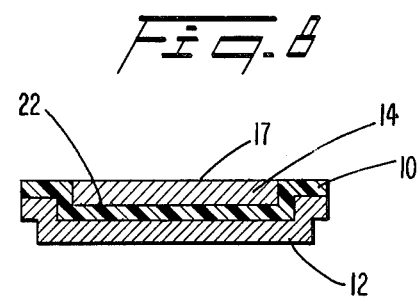
Figure 9:
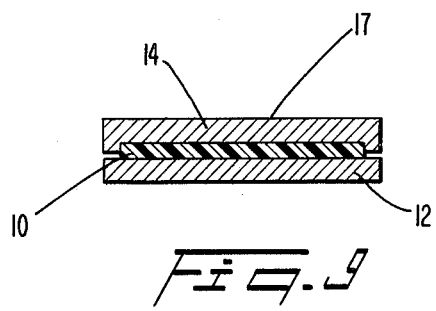

In the electret device 16 shown in FIG. 8, cover body 14, having a smaller surface area than dielectric body 10, is inserted in a recess 22 in dielectric body 10. On the other hand, a cover body 14 having a larger surface area than dielectric body 10 covers the whole of dielectric body 10, as shown in FIG. 9.

Figure 10:
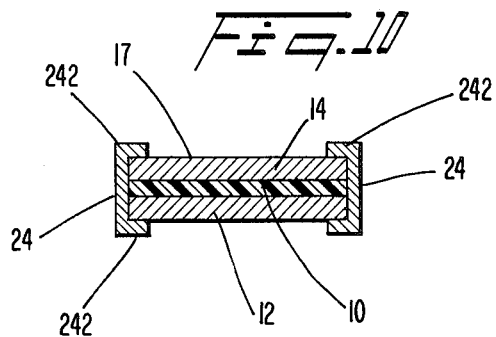
Figure 11:
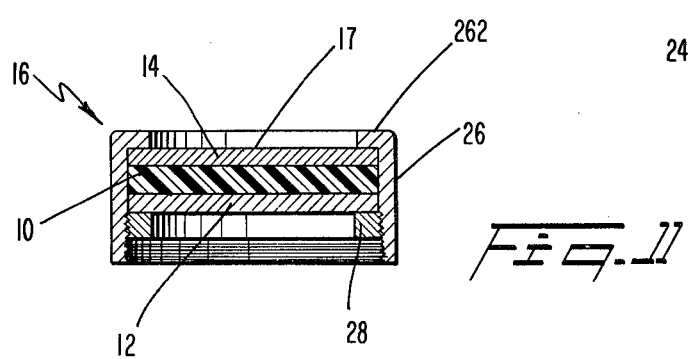

FIGS. 10 and 11 show other embodiments of the invention which utilize clamps. In the electret device 16 of FIG. 10, two clamps 24 hold a combination of cover body 14, dielectric body 10 and conductive electrode 12 at its opposite sides by the parallel legs 242 and 244 of each clamp 24. In the electret device 16 of FIG. 11, a combination of cover body 14, dielectric body 10 and conductive electrode 12 is inserted into a tube-like clamp piece 26 and secured on rib portion 262 of the clamp piece, and a threaded ring-like clamp piece 28 secures the combination between itself and rib portion 262.

What is claimed is:

1. An electret device comprising:
  a dielectric body provided with a surface electric charge and having two substantially flat and generally parallel surfaces, a conductive electrode secured on one of said flat surfaces, and a cover body attached on the opposite one of said flat surfaces, whereby said cover body has a uniform surface charge distribution.

2. An electret device according to claim 1, wherein said cover body is comprised of a conductive material.

3. An electret device according to claim 1, wherein said cover body is comprised of a semi-conductive material.

4. An electret device according to claim 1, wherein said cover body has a larger surface area than that of said dielectric body.

5. An electret device according to claim 1, wherein said cover body has a smaller surface area than that of said dielectric body.

6. An electret device according to claim 1, wherein said cover body is comprised of a non-conductive material.

7. An electret device according to claim 6, wherein said non-conductive cover body is formed from an inorganic substance.

8. An electret device according to claim 6, wherein said non-conductive cover body is formed from an organic substance.

9. An electret device according to claim 1, wherein said cover body is mechanically attached to said dielectric body.

10. An electret device according to claim 9, wherein said dielectric body has a recessed portion at the side adjacent said cover body, and said cover body is secured in said recessed part.

11. An electret device according to claim 9, wherein said cover body is secured to said dielectric body by means of a binding agent.

12. An electret device according to claim 9, wherein said cover body is fixed to said dielectric body by means of a fastener.

13. An electret device according to claim 11, where said fastener comprises a clamp.

14. An electret device according to claim 11, wherein said fastener comprises a stud.

* * * * *